United States Patent
Chevalier et al.

(10) Patent No.: US 9,704,967 B2
(45) Date of Patent: Jul. 11, 2017

(54) HETEROJUNCTION BIPOLAR TRANSISTOR

(71) Applicant: STMicroelectronics S.A., Montrouge (FR)

(72) Inventors: Pascal Chevalier, Chapareillan (FR); Didier Celi, Voiron (FR); Jean-Pierre Blanc, Theys (FR); Alain Chantre, Seyssins (FR)

(73) Assignee: STMICROELECTRONICS S.A., Montrouge (FR)

( * ) Notice: Subject to any disclaimer, the term of this patent is extended or adjusted under 35 U.S.C. 154(b) by 23 days.

(21) Appl. No.: 14/853,719

(22) Filed: Sep. 14, 2015

(65) Prior Publication Data
US 2016/0005836 A1 Jan. 7, 2016

Related U.S. Application Data

(62) Division of application No. 14/104,993, filed on Dec. 12, 2013, now Pat. No. 9,362,380.

(30) Foreign Application Priority Data

Dec. 19, 2012 (FR) .................... 12 62321

(51) Int. Cl.
| | |
|---|---|
| *H01L 29/66* | (2006.01) |
| *H01L 21/82* | (2006.01) |
| *H01L 29/737* | (2006.01) |
| *H01L 21/8249* | (2006.01) |
| *H01L 27/06* | (2006.01) |

(52) U.S. Cl.
CPC .... *H01L 29/66242* (2013.01); *H01L 21/8249* (2013.01); *H01L 27/0623* (2013.01); *H01L 29/66325* (2013.01); *H01L 29/737* (2013.01); *H01L 29/7378* (2013.01)

(58) Field of Classification Search
CPC ............ H01L 21/8249; H01L 27/0623; H01L 29/66242; H01L 29/66325; H01L 29/737; H01L 29/7378
USPC .................................................. 438/309–330
See application file for complete search history.

(56) References Cited

U.S. PATENT DOCUMENTS

| | | | |
|---|---|---|---|
| 4,236,294 | A | 12/1980 | Anantha et al. |
| 5,235,206 | A | 8/1993 | Desilets et al. |
| 5,620,908 | A | 4/1997 | Inoh et al. |
| 7,087,979 | B1 | 8/2006 | Naem |
| 2004/0212045 | A1 | 10/2004 | Tilke et al. |
| 2004/0222486 | A1 | 11/2004 | Ellis-Monaghan et al. |
| 2005/0079658 | A1 | 4/2005 | Li et al. |
| 2007/0134854 | A1 | 6/2007 | Zhang et al. |
| 2009/0203184 | A1 | 8/2009 | Magnee et al. |
| 2010/0062578 | A1 | 3/2010 | Wilhelm |
| 2011/0057266 | A1 | 3/2011 | Wallner et al. |

FOREIGN PATENT DOCUMENTS

| | | |
|---|---|---|
| EP | 1128429 A1 | 8/2001 |
| EP | 2315238 A1 | 4/2011 |

*Primary Examiner* — Mamadou Diallo
(74) *Attorney, Agent, or Firm* — Seed IP Law Group LLP

(57) ABSTRACT

The present disclosure is directed to a method that includes exposing a surface of a silicon substrate in a first region between first and second isolation trenches, etching the silicon substrate in the first region to form a recess between the first and second isolation trenches, and forming a base of a heterojunction bipolar transistor by selective epitaxial growth of a film comprising SiGe in the recess.

20 Claims, 4 Drawing Sheets

HETEROJUNCTION BIPOLAR TRANSISTOR

BACKGROUND

Technical Field

The present disclosure relates to a heterojunction bipolar transistor, and to a method of forming the same.

Description of the Related Art

For high frequency applications, bipolar transistors, and in particular heterojunction bipolar transistors (HBT), often provide a preferred solution. It is known to integrate heterojunction bipolar transistors with standard complementary metal oxide semiconductor CMOS processes, such that one or more HBTs can be implemented in a CMOS process with relatively few additional photolithography masks.

However, in advanced CMOS technologies, such as 28 nm or beyond, integration of heterojunction bipolar transistors becomes much more challenging due to constraints such as the limitation in the permitted height of the device, which is generally incompatible with known HBT structures, or leads to a complex and costly process.

BRIEF SUMMARY

The present disclosure is directed to an improved heterojunction bipolar transistor and method of forming a heterojunction bipolar transistor permitting integration with advanced CMOS technologies.

According to one aspect, there is provided a method comprising: exposing the surface of a silicon substrate in a first region between first and second isolation trenches; etching the silicon substrate in the first region to form a recess between the first and second isolation trenches; and forming a base of a heterojunction bipolar transistor by selective epitaxial growth of a film comprising SiGe in the recess.

According to an embodiment, the bottom of the recess is between 20 and 80 nm below of the surface of the silicon substrate.

According to an embodiment, the bottom of the recess is between 50 and 70 nm below of the surface of the silicon substrate.

According to an embodiment, forming the base comprises growing the film in the recess up to a level lower than or flush with the surface of the silicon substrate.

According to an embodiment, the method further comprises forming an emitter of the bipolar transistor by depositing an emitter material in the first region over the base.

According to an embodiment, the method further comprises, prior to forming the base: forming the first and second isolation trenches in the silicon substrate, and a third isolation trench such that the second isolation trench is in between and spaced apart from the first and third isolation trenches; depositing one or more layers over the silicon substrate; and etching an opening in the one or more layers to expose the substrate in the first region between the first and second isolation trenches, wherein the opening partially exposes a top surface of each of the first and second isolation trenches.

According to an embodiment, the third isolation trench is less deep than the first and second isolation trenches.

According to an embodiment, the method further comprises a photolithography step for patterning the one or more layers to form a gate stack of at least one MOS transistor.

According to an embodiment, the method further comprises, prior to forming the base, forming by ion implantation a buried collector of the bipolar transistor at a level in the silicon substrate below the base.

According to another aspect, there is provided a heterojunction bipolar transistor comprising a base region comprising SiGe formed in a recess in a silicon substrate between first and second isolation trenches.

According to an embodiment, the recess is between 20 and 80 nm in depth.

According to an embodiment, the recess is between 50 and 70 nm in depth.

According to an embodiment, the transistor further comprises an emitter formed directly over the base.

According to another aspect, there is provided an integrated circuit comprising: the above heterojunction bipolar transistor; and at least one MOS transistor.

BRIEF DESCRIPTION OF THE SEVERAL VIEWS OF THE DRAWINGS

The foregoing and other features and advantages will become apparent from the following detailed description of embodiments, given by way of illustration and not limitation with reference to the accompanying drawings, in which.

As is normal in the case of drawings of semiconductor structures, the various figures are not drawn to scale.

DETAILED DESCRIPTION

Figure 1:
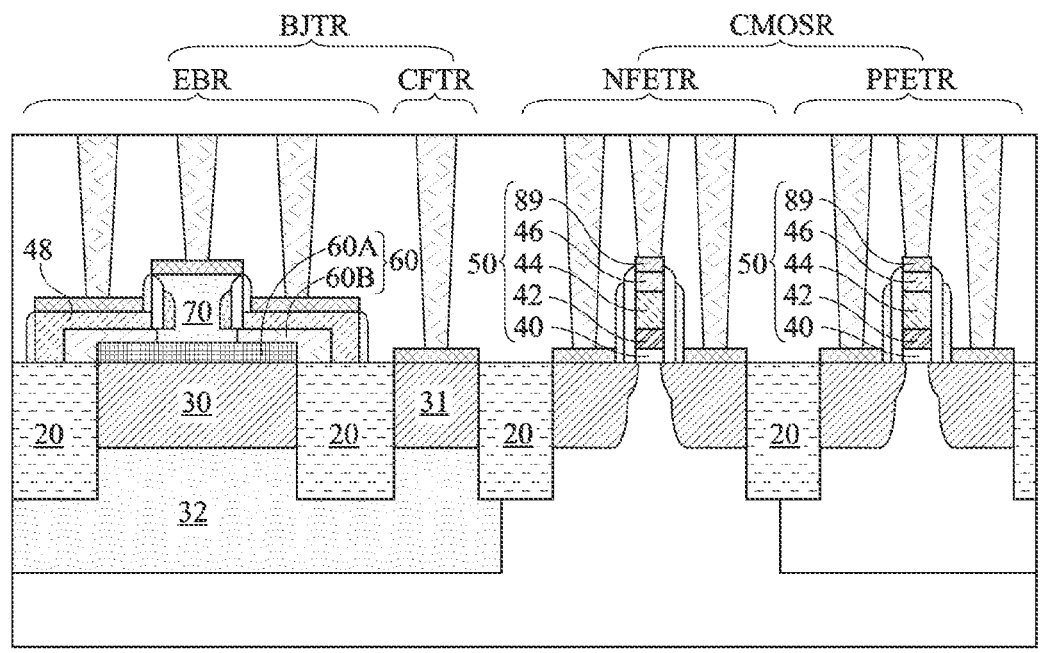
FIG. 1 is a cross-section view of a known integrated circuit comprising a bipolar transistor.

FIG. 1 is a cross-section view reproducing FIG. 19 of U.S. Patent Application Publication No. 2011/0057266.

As illustrated on the left hand side in FIG. 1, a semiconductor substrate includes a bipolar transistor having a subcollector region 32 connected with a collector contact via a subcollector feedthrough 31, and formed under a collector region 30. An epitaxial base 60A is formed extending up from the surface of the semiconductor substrate, over the collector 30. An emitter 70 is formed extending up from the base 60A, and a polycrystalline extrinsic base portion 60B is also formed over the base 60A on each side of the emitter 70.

As illustrated on the right hand side in FIG. 1, a pair of CMOS devices are also formed, each having a gate stack 50 comprising a dielectric material layer 40, a metal layer 42, semiconductor material layers 44 and 46, and a gate metal-semiconductor alloy region 89.

While the structure of FIG. 1 provides an example of a bipolar transistor having an epitaxial base integrated with a CMOS process, one drawback of this solution is the overall height of the bipolar device. Indeed, the epitaxial base 60A and emitter 70 are stacked above the semiconductor substrate, leading to a relatively high device. Another drawback of the structure of FIG. 1 is that it is very complex to fabricate.

Figure 2:
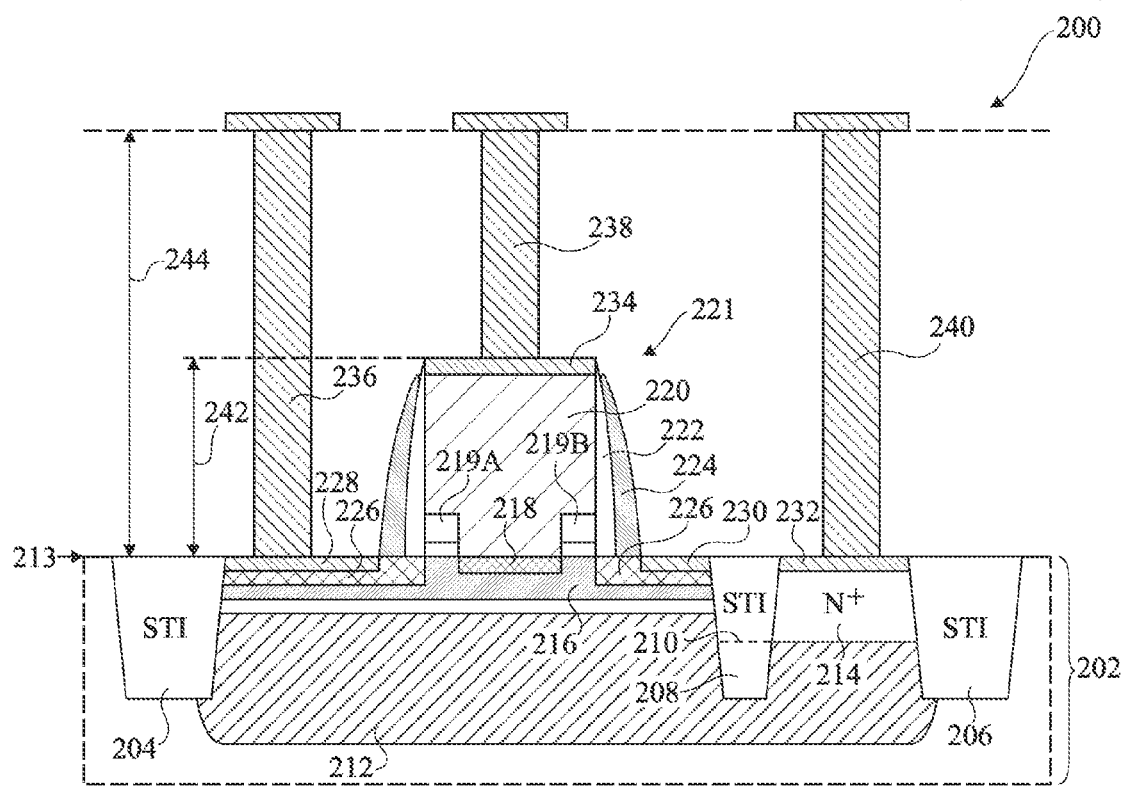
FIG. 2 is a cross-section view of a portion of an integrated circuit comprising a heterojunction bipolar transistor according to an example embodiment of the present disclosure.

FIG. 2 is a cross-section view of an integrated circuit 200 comprising a heterojunction bipolar transistor according to an embodiment of the present disclosure.

A semiconductor substrate 202, for example formed of p-type silicon, has shallow trench isolations (STIs) 204 and 206 delimiting the bipolar device on each side, and an STI 208 positioned between the STIs 204 and 206. The isolation trenches are trenches filled with a dielectric material, for example silicon dioxide. A buried collector region 212 is positioned between the STIs 204 and 208, having a top level at a depth of between 20 and 80 nm below the surface 213 of the silicon substrate, and a bottom level of between 200 and 300 nm below the surface 213 of the silicon substrate. For example the collector 212 has a thickness of between 150 and 250 nm. The STI 208 separates the base of the device from a collector contact region 214, which for example extends to a depth of between 30 and 150 nm from the surface 213 of the silicon substrate. The STIs 204, 206 and 208 for example all extend to a depth of between 150 and 300 nm from the surface 213 of the silicon substrate, for example around 250 nm. As shown by a dashed line 210 in FIG. 2, in some embodiments the STI 208 can be shallower than the STIs 204 and 206, for example extending to a depth of between 50 and 150 nm, such that a shorter conduction path is provided between the collector contact region 214 and the portion of the collector formed under the base of the bipolar transistor.

An at least partially buried base 216 is formed by an epitaxial film comprising SiGe, for example formed of SiGeC, although other materials may be used. Optionally, the base 216 comprises a capping layer of Si. The buried base for example extends from the surface 213 of the silicon substrate into the substrate to a depth of between 20 and 80 nm, for example between 50 and 70 nm. The base width, which corresponds to the distance between the STIs 204 and 208, is for example between 200 and 300 nm.

An emitter of the HBT comprises a zone 218 extending a short way into the base film 216, and an emitter 220 forming a stack 221 over a region of the base 216. The zone 218 for example corresponds to a zone in which doping ions, for example of n-type, have migrated from the emitter 220 into the base film 216 through an opening formed in a hard mask layer 219A, 219B present at the bottom of the emitter 220. The width of this opening is for example between 40 and 80 nm. The width of the emitter 220 is for example between 80 and 200 nm.

The emitter stack 221 for example has a first layer of spacers 222 and a second layer of spacers 224 formed on each side. The total width of the spacers on each side of the stack 221 is for example between 10 and 20 nm.

Below the spacers 222, 224 on each side of the emitter stack 221 an extrinsic base 226 is for example provided. Furthermore, between the edges of the spacers and the STIs 204 and 208 on each side of the emitter stack 221, metal silicide layers 228 and 230 are present for making contact with the base. Furthermore, a silicide layer 232 is present over the N+ region 214 for the collector contact, and a silicide layer 234 is present over the emitter 220 for the emitter contact. As illustrated, a base contact 236 for example makes contact with the silicide layer 228 on one side of the emitter stack 221, an emitter contact 238 for example makes contact with the silicide 234 over the emitter, and a collector contact 240 for example makes contact with the silicide 232 over the N+ region 214.

The height, indicated by an arrow 242 in FIG. 2, of the top of the emitter stack 221 from the surface 213 of silicon substrate, for example measured from the planarized top surface of the STI 204, is for example between 50 and 70 nm. The contact height, from the top of the emitter stack, is for example of between 150 and 200 nm. This leads to an overall height, indicated by the arrow 244 in FIG. 2, of the device including the contacts 236, 238 and 240 of between 200 and 250 nm. Such an overall height is possible due to the buried base 216, which for example does not extend higher than the surface 213 of the substrate 202. The base 216 is for example of around 50 nm in thickness, and such a base formed above the surface of the substrate would generally lead to a total height of the device above the substrate 202 of more than 250 nm, and generally of 300 nm or more.

A method of forming the heterojunction bipolar transistor of FIG. 2, alongside a MOS transistor, will now be described with reference to the cross-section views of FIGS. 3A to 3I. In the example of FIGS. 3A to 3I, the MOS transistor is an n-channel MOS (NMOS) transistor, but it will be apparent to those skilled in the art how the process could be adapted to form one or more p-channel MOS transistors in addition or instead of one or more NMOS transistors. Furthermore, the process described results in the formation of an NPN bipolar transistor, but it will be apparent to those skilled in the art how the process could be adapted to the formation of a PNP bipolar transistor.

Figure 3A:
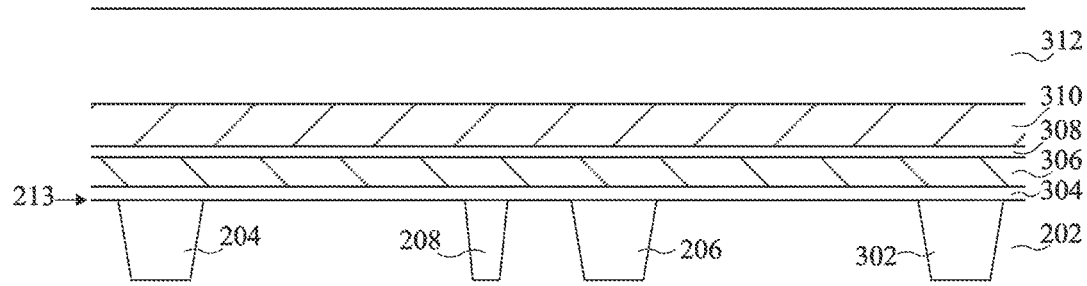
FIGS. 3A to 3I are cross-section views of an integrated circuit at various stages during formation of a heterojunction bipolar transistor according to an example embodiment of the present disclosure.

FIG. 3A is a cross-section view of a semi-conductor device part way through fabrication, comprising a semiconductor substrate 202, for example formed of silicon. The STIs 204, 206 and 208 of FIG. 2 are already present, along with a further STI 302. Each of the STIs 204, 206 and 302 is for example between 150 and 300 nm in width at its widest point, while the STI 208 is for example between 100 and 150 nm in width at its widest point. In the embodiment of FIG. 3A, each of the STIs 204 to 208 and 302 has the same depth, for example of between 150 and 300 nm from the surface 213 of the silicon substrate, although in alternative embodiments, as described above, STI 208 could be less deep than the other STIs.

Successive layers 304 to 310 are formed over the substrate 202, covering the STIs. As will become apparent herein after, these layers form the gate stack of one or more MOS transistors. The layers comprise, in order starting from the surface of the substrate 202: a layer 304 of a dielectric material, for example of SiON, formed over the substrate 202, and for example having a thickness of between 2 and 10 nm; a layer 306 of a further dielectric material, for example of HfSiON, and for example having a thickness of between 1 and 3 nm; a layer 308 of a metal, for example lanthanum and for example having a thickness of between 1 and 3 nm; a layer 310 of TiN, for example having a thickness of between 5 and 10 nm; and a layer 312 of amorphous silicon aSi for example having a thickness of between 10 and 50 nm. It will be apparent to those skilled in the art that the above layers are merely examples, and that the number of layers and material used for each layer could be varied depending on the desired characteristics of the MOS transistors.

Figure 3B:
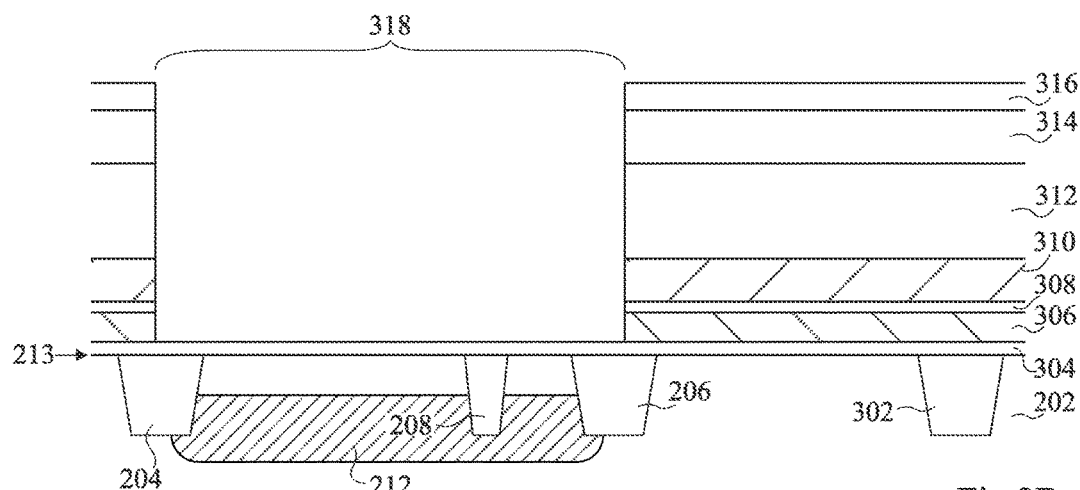

FIG. 3B illustrates a subsequent step in which a hard mask layer 314 and then a photolithography resist layer 316 are deposited over the amorphous silicon layer 312. A photolithography operation is then used to etch an opening 318 through the layers 306 to 316, stopping at the dielectric layer 304, which is for example an oxide such as SiON. The area of opening 318 corresponds to an area in which the bipolar transistor is to be formed, and for example extends between the STIs 204 and 206. Furthermore, the etched area 318 for example overlaps the top surface of the STIs 204 and 206 on each side.

A collector implantation step is then performed in the opening 318 to form the buried collector region 212. For example, an implantation of arsenic is used to form an n-type collector. The resulting buried collector region 212 for example has a top surface at between 20 and 80 nm below the surface 213 of the silicon structure, and for example extends to a depth of between 200 and 300 nm.

Figure 3C:
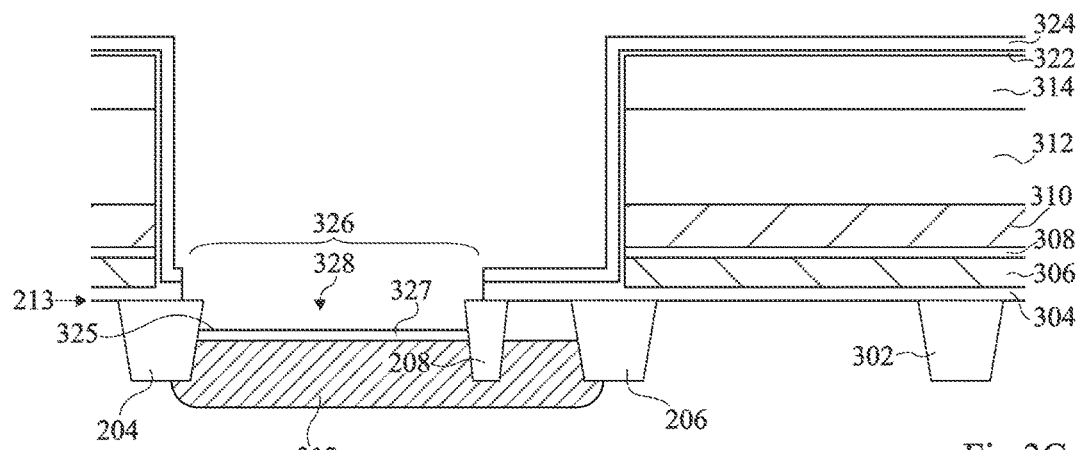

FIG. 3C illustrates a subsequent step in which a hard mask is deposited, for example comprising an oxide layer 322 covered by a nitride layer 324. In alternative embodiments, a thicker layer of oxide could be used to provide an oxide only hard mask. A photolithography step is used to open the hard mask in a region 326, between the STIs 204 and 208, and for example partially exposing the top surface of these STIs on each side.

A further etching operation is then performed to make a recess 328 between the STIs 204 and 208. For example, the bottom of the recess 328, shown by a line 325 in FIG. 3C, is between 50 and 70 nm below the surface 213 of the silicon substrate. The etchant is for example HCl.

The depth of the recess is for example chosen such that a layer 327 of p-type substrate material remains at the bottom of the recess 328, covering the collector 212. This layer 327 for example has a thickness of between 10 and 30 nm. This layer 327 defines the base-collector junction. In alternative embodiments, for example to achieve a high collector doping at the base-collector junction, the recess 328 could extend into the collector 212. For example, the bottom 325 of the recess could be at a greater depth below the surface 213 of the silicon substrate 202, and/or the top of the collector 212 could be less deep.

Figure 3D:
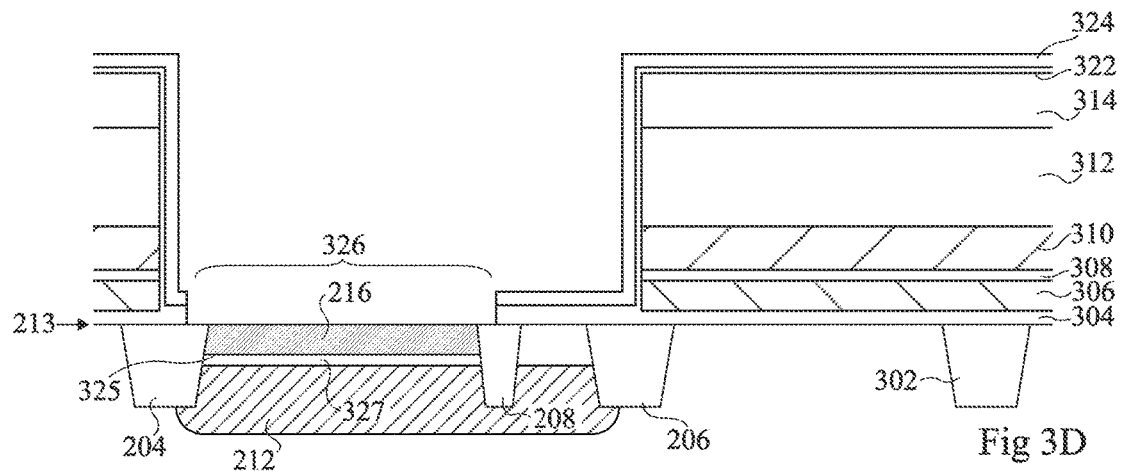

FIG. 3D illustrates a subsequent step in which selective epitaxial growth (SEG) is for example used to form the at least partially buried base 216 of the HBT. For example, the epitaxial layer selectively grows on the silicon at the bottom of recess 328, and not on the dielectric surfaces, such as the STIs 204, 208 and hard mask 324. Alternatively, the epitaxial layer selectively grows at a faster rate on the silicon layer at the bottom of the recess 328 than on the dielectric layers, and etching, for example using HCl, is performed to remove the growth on the dielectric layers. In either case, the conditions for achieving such an epitaxial growth, such as the gas flow rates and temperature, are well known to those skilled in the art.

In some embodiments, the epitaxial base 216 is formed of an SiGeC film, which is then for example doped with boron. In alternative embodiments, it would be possible to form other types of epitaxial silicon films forming the base, such as for example a doped Si or SiGe film. Furthermore, in some embodiments, the base 216 can comprise a silicon capping, and the density of germanium in the base could be graded.

In some embodiments, the thickness of film forming the base 216 is less than or equal to the depth of recess 328 below the surface 213 of the substrate 202. Thus the top surface of the base 216 is below or flush with the surface 213 of the substrate 202. In alternative embodiments, the film forming the base 216 could extend to a level higher than the surface of the substrate 202, in other words passing the top surfaces of the STIs 204 and 208 on each side, such that it is only partially buried.

Optionally, after formation of the base 216, an additional collector implantation step may also be performed at this stage, to implant a portion of the collector 212 directly under the base 216.

Figure 3E:
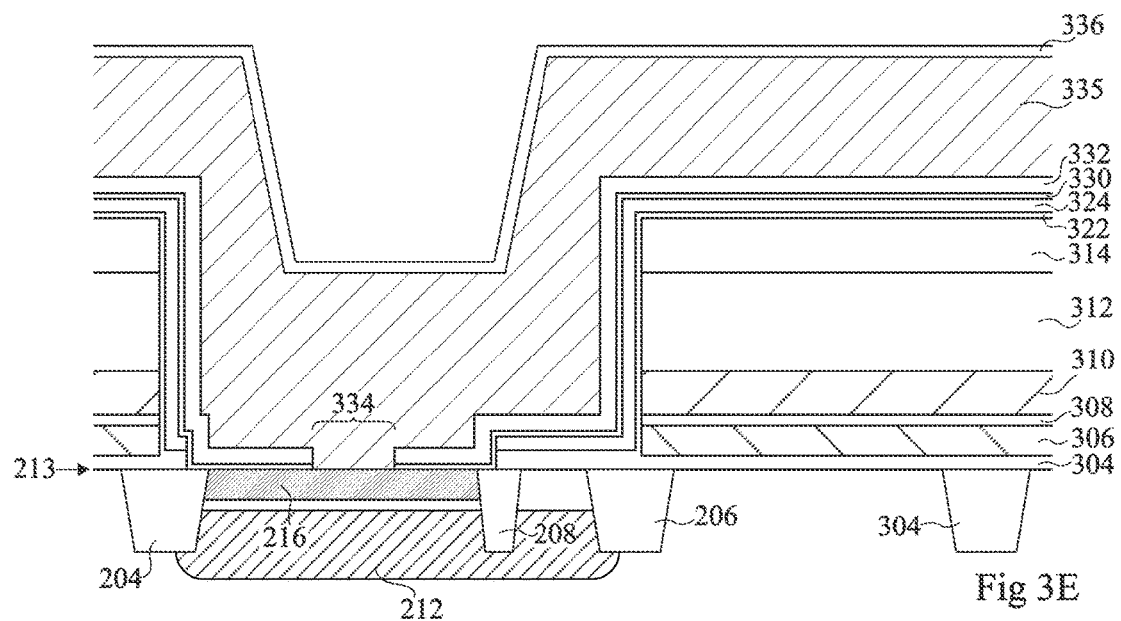

FIG. 3E illustrates a subsequent step in which a further hard mask is deposited over the device, for example comprising an oxide layer 330 and a nitride layer 332. A photolithography operation is then performed to open the hard mask in region 334 in a region of the base 216. The width of region 334 is for example between 40 and 75 nm, and defines the emitter finger width.

A silicon layer 335 is then for example deposited over the device, and is for example doped in-situ to be of n-type, for example with arsenic. The silicon layer 335 for example has a thickness of between 50 and 100 nm, or in the case that the top of the base 216 is flush with the surface 213 of the silicon substrate 202, of between 50 and 70 nm. A resin layer 336 is for example then deposited over layer 335.

Figure 3F:
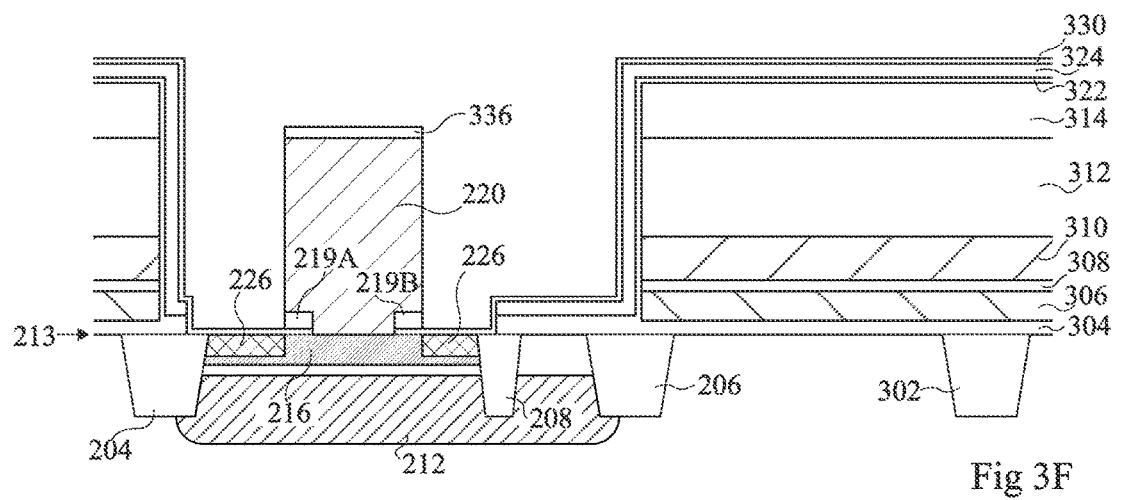

FIG. 3F illustrates a subsequent step in which a photolithography step is used to pattern the resin and define the emitter 220 of the HBT, formed of the doped silicon material of layer 335. The etching for example stops at the oxide layer 330. The width of the emitter is for example wider than the width of region 334, and thus portions 219A and 219B of the nitride layer 332 for example remain in the emitter stack, one on each side of the opening 334.

An implantation passing through the oxide layer 330 is then for example performed in order to form the extrinsic base 226 in top regions of the base 216 on each side of the emitter 220. The extrinsic base 226 for example has a thickness of between 20 and 40 nm, and is for example a heavily doped P+ region in the case that the HBT is an NPN bipolar transistor. The collector is for example protected from implantation by the nitride layer 324, and the emitter 220 is protected by the resin layer 336.

Figure 3G:
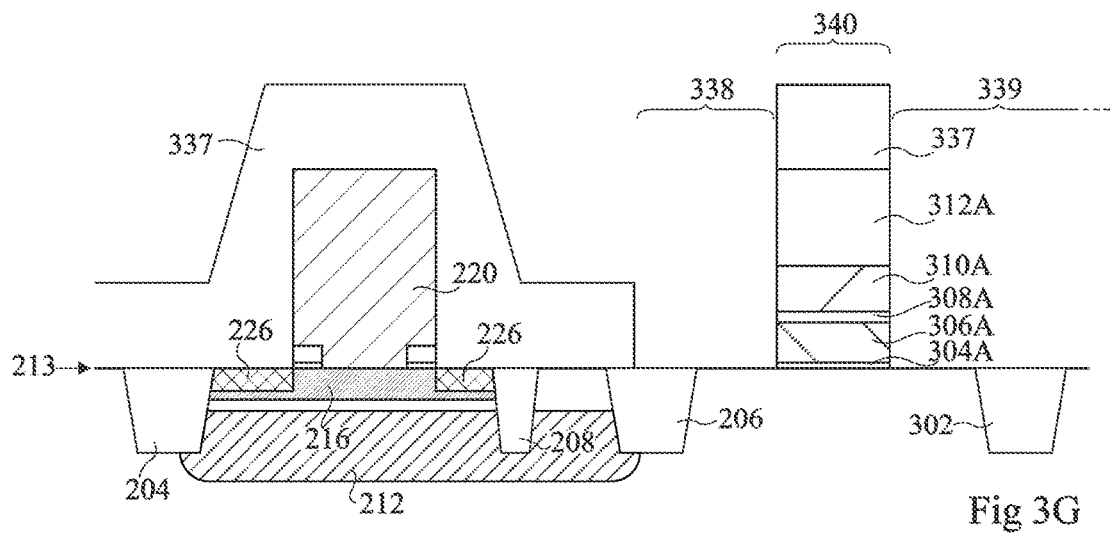

FIG. 3G illustrates a subsequent step in which the resin has been stripped and the oxide and nitride layers 322, 324 and 330 have for example been removed by a wet etch. The hard mask layer 314 has also been removed.

A further hard mask layer 337 is then deposited, and a photolithography step is used form the gate stack of the MOS transistor on the right hand side of the structure. In particular, regions 338 and 339 are etched on each side of a region 340 in which the gate stack is formed of portions 304A to 312A of the layers 304 to 312. The gate stack is for example equal distance from the STIs 206 and 302. The region 336 for example extends to the STI 206.

Figure 3H:
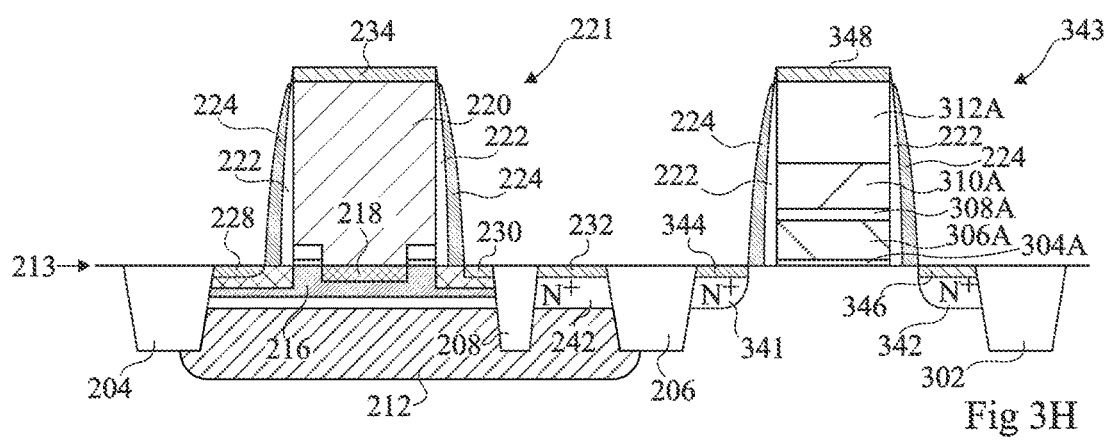

FIG. 3H illustrates a subsequent step in which the hard mask 337 is removed, and spacers are formed on each side of the MOS gate stack and of the emitter stack. For example, two layers of spacers are formed. In particular, spacers 222 are formed on the each side of the emitter stack and on each side of the MOS gate stack, and then further spacers 224 form a second layer over each of the spacers 222. The spacers 222 and 224 are for example formed of different oxides.

Source/drain regions are then for example implanted using a further mask (not illustrated in FIG. 3I), which for example not only forms heavily doped n-type source/drain regions 341 and 342 each side of the spacers of the MOS gate stack 343, but also penetrates the substrate between the STIs 208 and 206, to form the heavily doped n-type region 242 used to electrically connect the collector 212. Furthermore, while not illustrated in the figures, a further collector implantation operation could be performed at this stage using a further mask, for example to reduce the resistance in the collector and improve dynamic performance of the HBT.

A source/drain activation anneal of the MOS transistor for example results in the doping species in the emitter 220 being driven into an adjacent zone of the base 216, as labeled 218 in FIG. 3H.

The metal silicides 228, 230 and 234 for the contacts of the HBT, and silicides 344, 346 and 348 respectively for the source/drain and gate contacts of the MOS transistor are then for example formed by depositing a metal, such as Ni or Ti, and performing an anneal.

Figure 3I:
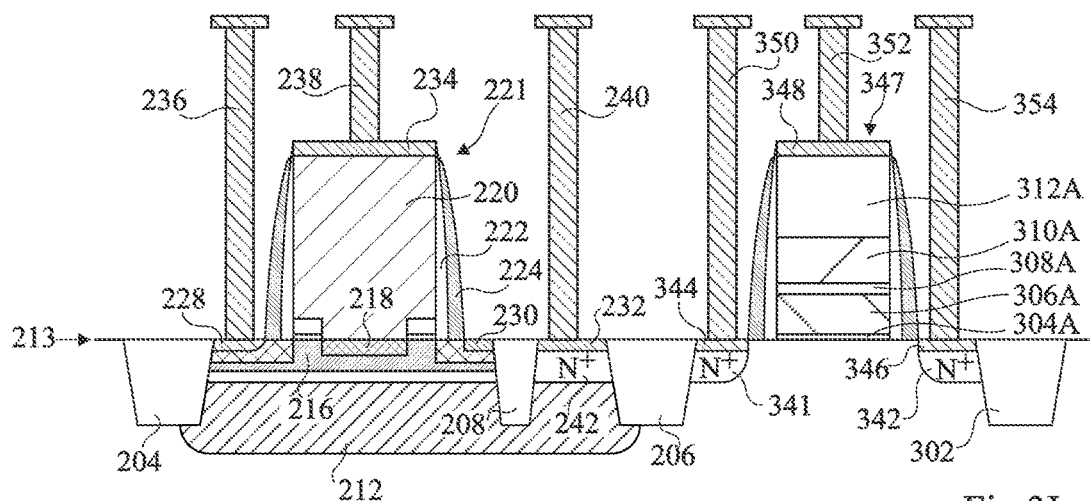

FIG. 3I illustrates yet a further step in which the contacts 236, 238 and 240 respectively contacting the base, emitter and collector silicides 228, 234 and 232 of the HBT are formed, as well as contacts 350, 352 and 354 respectively contacting the silicides 344, 346 and 348 of the source/drain and gate of the MOS transistor.

Thus, advantageously, a method has been described of forming a heterojunction bipolar transistor having not only a buried collector, but also an at least partially buried base. This is achieved by etching back the silicon substrate where the base is to be formed, prior to forming the base by epitaxial growth of a film comprising SiGe. This advantageously leads to a reduction in the overall height of the HBT device. Furthermore, the method involves relatively few additional masks as compared to a CMOS process, meaning that the HBT is formed at a relatively low cost.

While a number of embodiments of the present disclosure have been described, it will be apparent to those skilled in the art that there are numerous further modifications and variations that could be applied.

For example, it will be apparent to those skilled in the art that the order of certain steps in the process may be changed, for example of the implantation steps, and that one or more additional steps could be performed during the process.

Furthermore, it will be apparent to those skilled in the art that the various dimensions are provided in the present disclosure by way of example only, and that the dimensions can be adapted depending on device characteristics to be achieved.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    forming a heterojunction bipolar transistor, the forming of the bipolar transistor including:
        forming in a substrate a first isolation trench and a second isolation trench separated from each other;
        forming a third isolation trench, the second isolation trench being between the first isolation trench and the third isolation trench;
        forming a buried collector in the substrate extending between the first isolation trench and the third isolation trench;
        forming a collector contact between the second isolation and the third isolation trench;
        forming a recess in the substrate between the first isolation trench and the second isolation trench; and
        forming a base region in the recess below a top surface of the substrate between the first and second isolation trenches, the base region including silicon germanium, and the entire base region being formed below the top surface of the substrate.

2. The method of claim 1 wherein a bottom of said recess is between 20 and 80 nm below of the surface of said substrate.

3. The method of claim 1 wherein a bottom of said recess is between 50 and 70 nm below of the surface of said substrate.

4. The method of claim 1 wherein forming said base region comprises selectively epitaxially growing a film in the recess up to a level lower than or flush with the surface of the substrate, the film including the silicon germanium.

5. The method of claim 1, further comprising forming an emitter of said bipolar transistor by depositing an emitter material in over said base region between the first isolation trench and the second isolation trench.

6. The method of claim 1, further comprising, prior to forming said base region:
    depositing one or more layers over said substrate; and
    etching an opening in said one or more layers to expose said substrate between said first and second isolation trenches, wherein said opening partially exposes a top surface of each of said first and second isolation trenches.

7. The method of claim 6 wherein said second isolation trench is less deep than said first and third isolation trenches.

8. The method of claim 6, further comprising forming a gate stack of a MOS transistor by patterning and removing portions of the one or more layers.

9. The method of claim 1 wherein a top surface of the first isolation trench, a top surface of the second isolation trench, and a top surface of the base region are coplanar with the top surface of the substrate.

10. The method of claim 1 wherein the forming of the buried collector includes depositing a layer over the substrate and forming an opening in the layer, the opening extending between the first and third isolation trenches.

11. A method, comprising:
    forming a first, second, and third isolation trench in a substrate, the second isolation trench being between the first and the third isolation trench;
    forming a gate stack of a MOS transistor the forming of the gate stack including:
        forming a dielectric layer;
        forming a conductive layer; and
        forming an amorphous silicon layer;
    forming an opening through the gate stack;
    forming a buried collector of a bipolar transistor through the opening and in the substrate, the buried collector extending from the first isolation trench to the third isolation trench;
    forming a collector contact between the second and the third isolation trench; and
    forming a base of the bipolar transistor between the first isolation trench and the second isolation trench, the base being below a top surface of the substrate, a top surface of the first isolation trench, a top surface of the second isolation trench, and a top surface of the base are coplanar with the top surface of the substrate, the buried collector being formed below the base.

12. The method of claim 11, further comprising forming an emitter stack above the base between the first and the second isolation trench, the gate stack being separated from the emitter stack by the second and the third isolation trench.

13. The method of claim 12 wherein a height of the emitter stack starting from the top surface of the substrate is substantially the same as a height of the gate stack starting from the top surface of the substrate.

14. The method of claim 11, further comprising forming a fourth isolation trench in the substrate, the third isolation trench being between the second and fourth isolation trench, the gate stack being between the third and fourth isolation trench.

15. The method of claim 14, further comprising forming source/drain regions in the substrate between the third and fourth isolation trench.

16. A method, comprising:
   forming a first, second, and third isolation trench in a substrate, the second isolation trench being between the first and the third isolation trench;
   forming a collector in the substrate extending from the first isolation trench to the third isolation trench;
   forming a recess in the substrate between the first isolation trench and the second isolation trench;
   forming a base in the recess, the base having a surface that is coplanar with a surface of the substrate; and
   forming an emitter stack on the base.

17. The method of claim 16, further comprising forming an extrinsic base by implanting a portion of the base, the extrinsic base having a surface that is coplanar with the surface of the substrate.

18. The method of claim 16, further comprising forming a collector contact between the second and third isolation trench.

19. The method of claim 16, further comprising forming a silicide layer on a portion of the extrinsic base, the silicide layer having a fourth surface that is coplanar with the first surface.

20. The method of claim 16, further comprising:
   forming a fourth isolation trench in the substrate, the third isolation trench being between the second and fourth isolation trench; and
   forming a gate stack between the third and fourth isolation trench.

* * * * *